United States Patent
Lachner et al.

(10) Patent No.: US 8,125,072 B2
(45) Date of Patent: Feb. 28, 2012

(54) DEVICE INCLUDING A RING-SHAPED METAL STRUCTURE AND METHOD

(75) Inventors: Rudolf Lachner, Ingolstadt (DE); Josef Boeck, Munich (DE); Klaus Aufinger, Ottobrunn (DE); Herbert Knapp, Munich (DE)

(73) Assignee: Infineon Technologies AG, Neubiberg (DE)

( * ) Notice: Subject to any disclaimer, the term of this patent is extended or adjusted under 35 U.S.C. 154(b) by 130 days.

(21) Appl. No.: 12/540,491

(22) Filed: Aug. 13, 2009

(65) Prior Publication Data
US 2011/0037163 A1    Feb. 17, 2011

(51) Int. Cl.
*H01L 23/48* (2006.01)
(52) U.S. Cl. ......... 257/693; 257/694; 257/699; 257/728
(58) Field of Classification Search .................. 257/693, 257/694, 699, 728
See application file for complete search history.

(56) References Cited

U.S. PATENT DOCUMENTS

| | | | |
|---|---|---|---|
| 6,495,917 B1 | 12/2002 | Ellis-Monoghan et al. | |
| 7,141,867 B2 * | 11/2006 | Tao et al. | 257/666 |
| 7,253,487 B2 | 8/2007 | Chen | |
| 2007/0064398 A1 | 3/2007 | Lee et al. | |
| 2007/0164406 A1 * | 7/2007 | Tseng | 257/666 |
| 2009/0008793 A1 | 1/2009 | Pohl et al. | |
| 2009/0146297 A1 * | 6/2009 | Badakere et al. | 257/737 |

* cited by examiner

*Primary Examiner* — Tan N Tran
(74) *Attorney, Agent, or Firm* — Dicke, Billig & Czaja, PLLC

(57) ABSTRACT

A device includes a semiconductor chip with a ring-shaped metal structure extending along the contour of a first main surface of the semiconductor chip. An encapsulation body encapsulates the semiconductor chip and defines a second main surface. An array of external contact pads attaches to the second main surface of the encapsulation body, and at least one external contact pad of the array of external contact pads electrically couples to the ring-shaped metal structure.

18 Claims, 13 Drawing Sheets

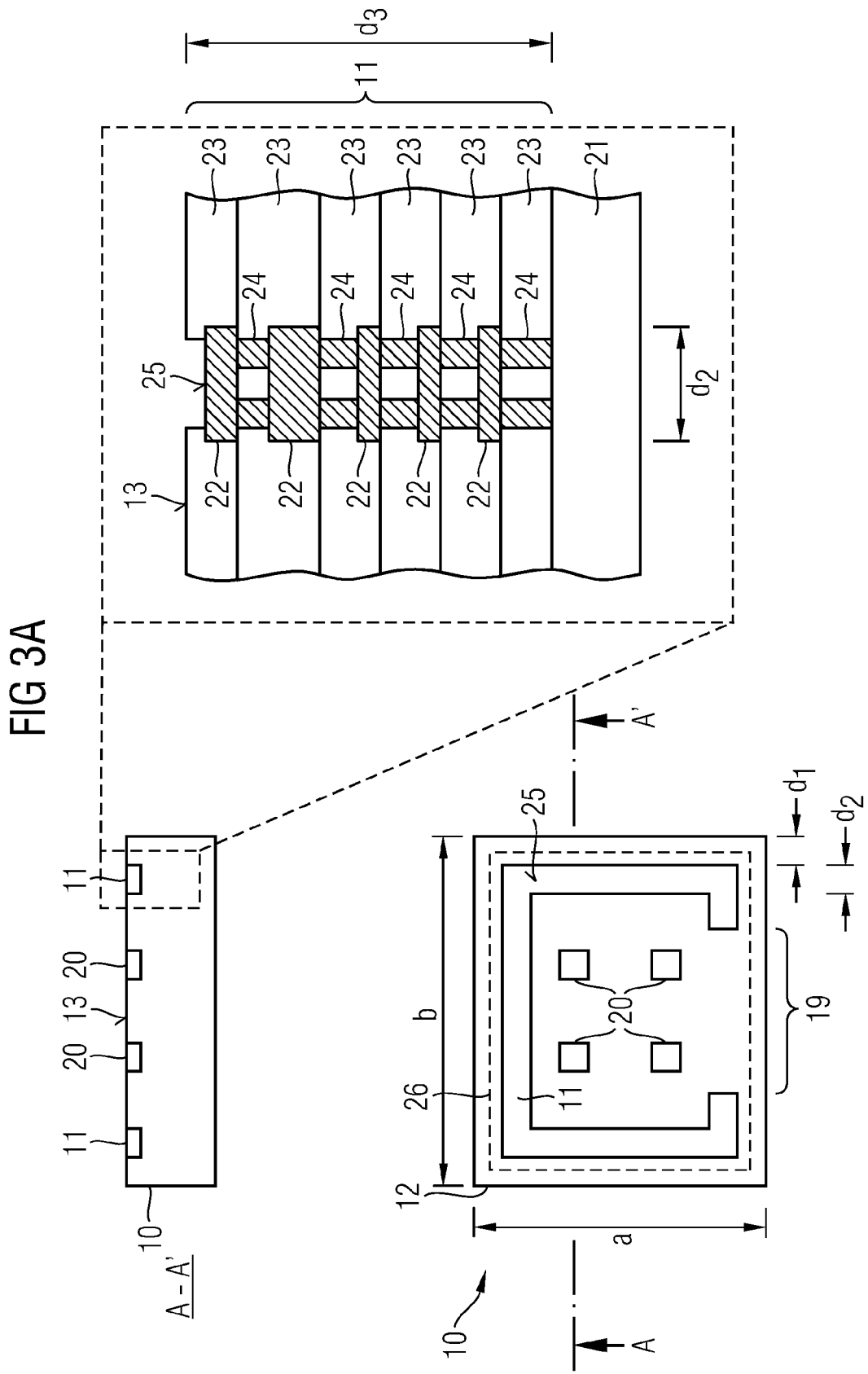

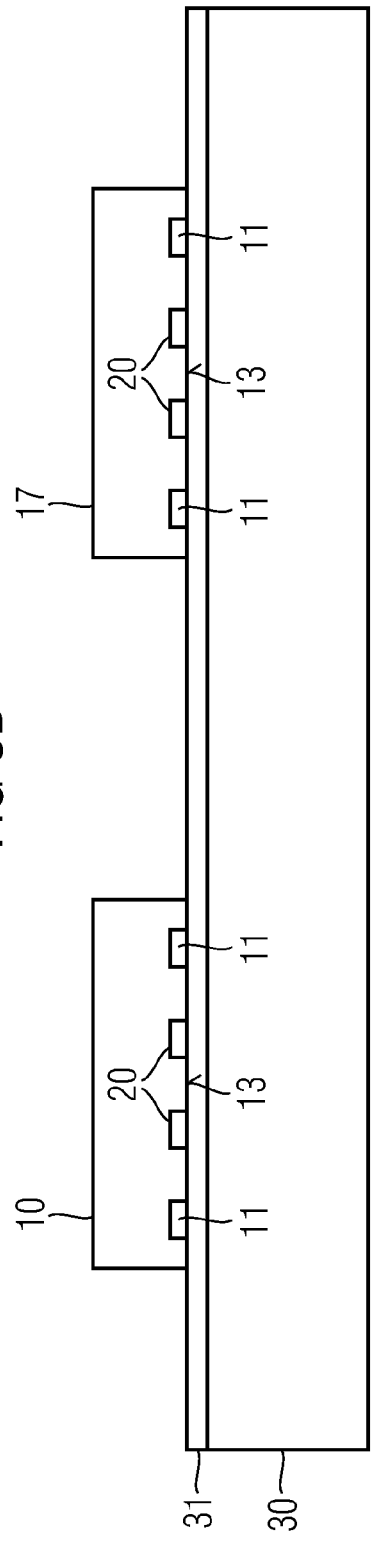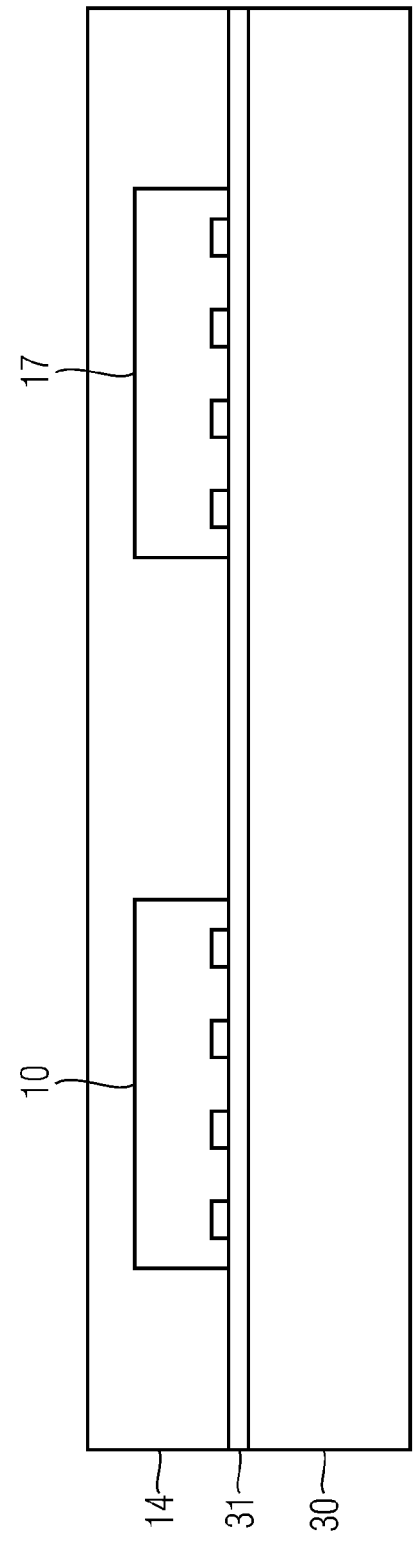

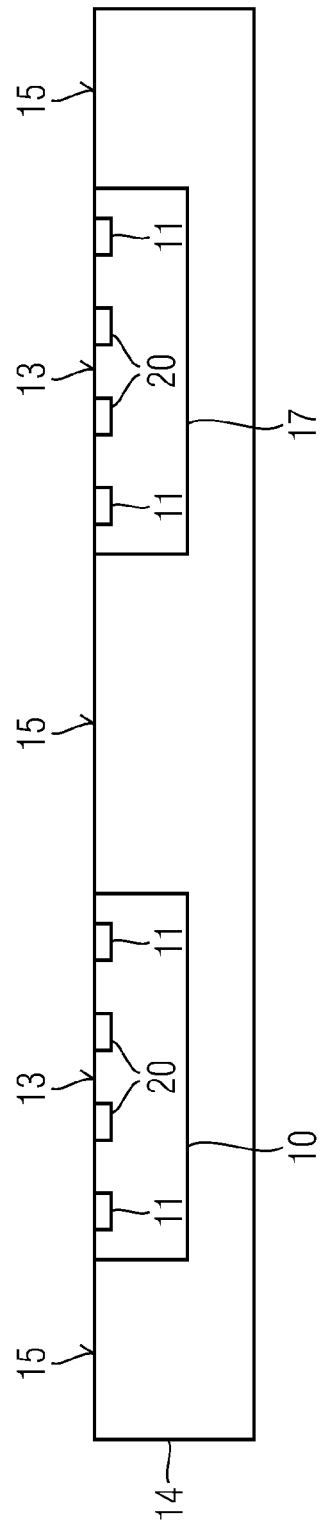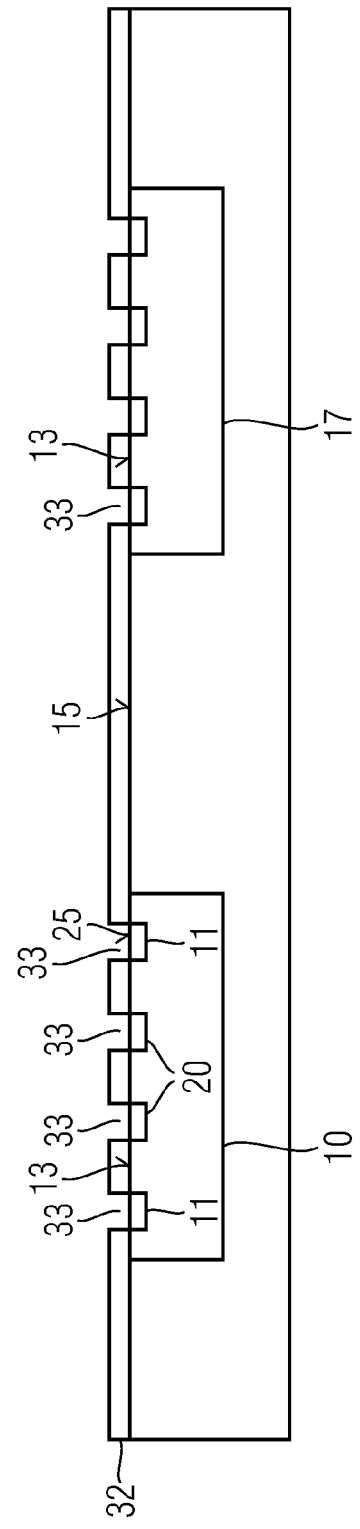

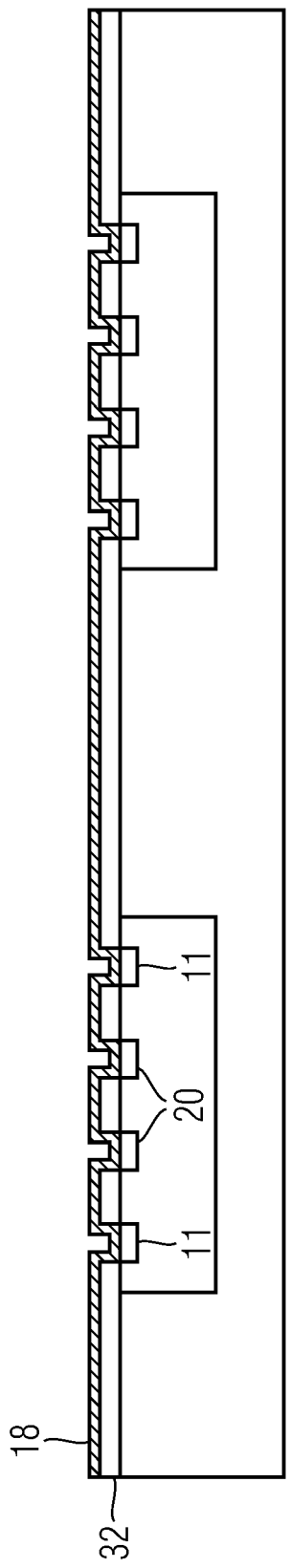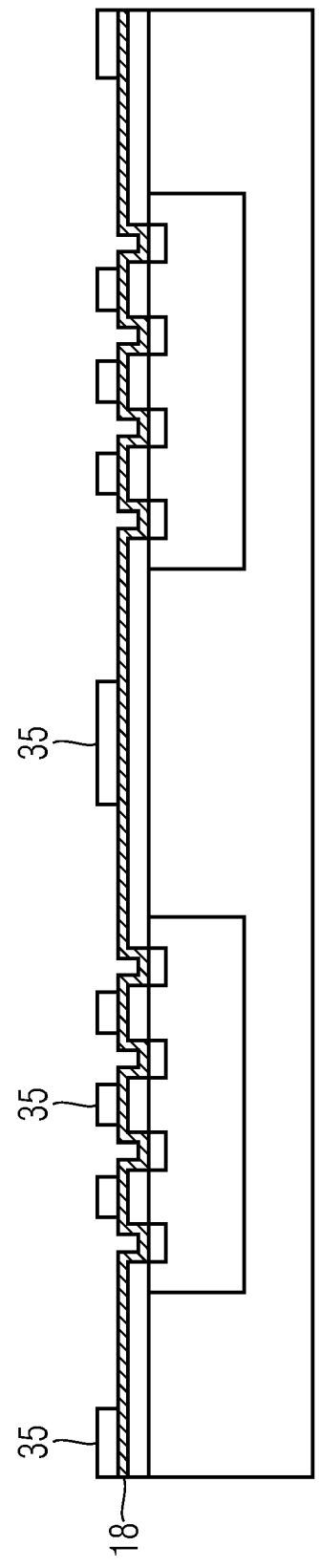

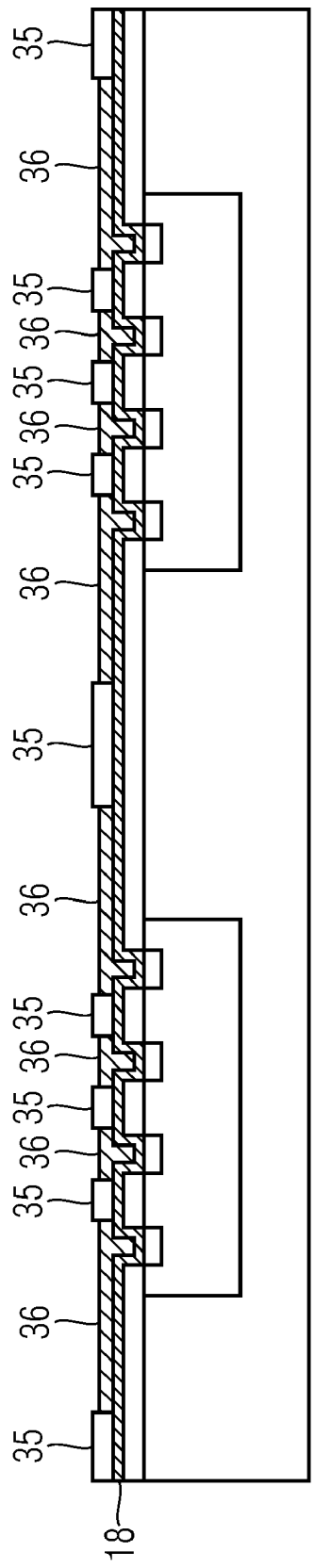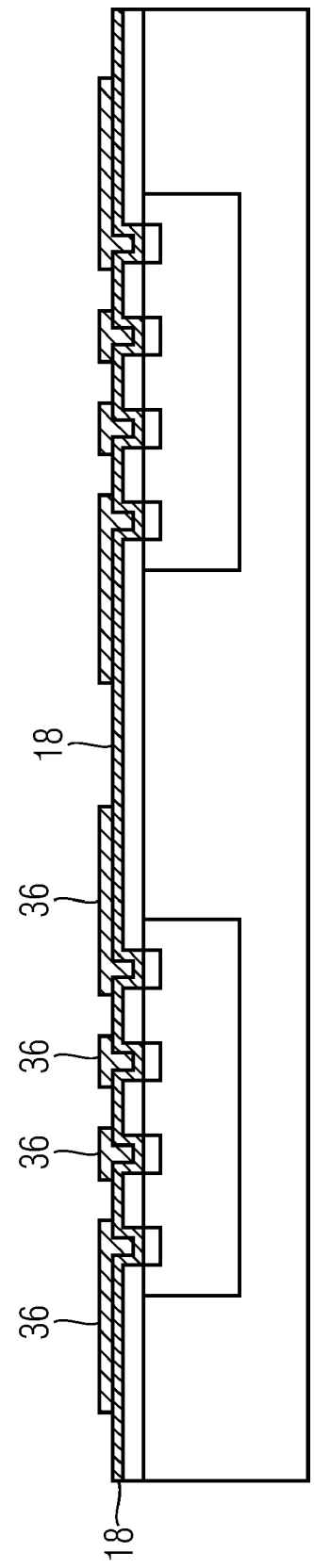

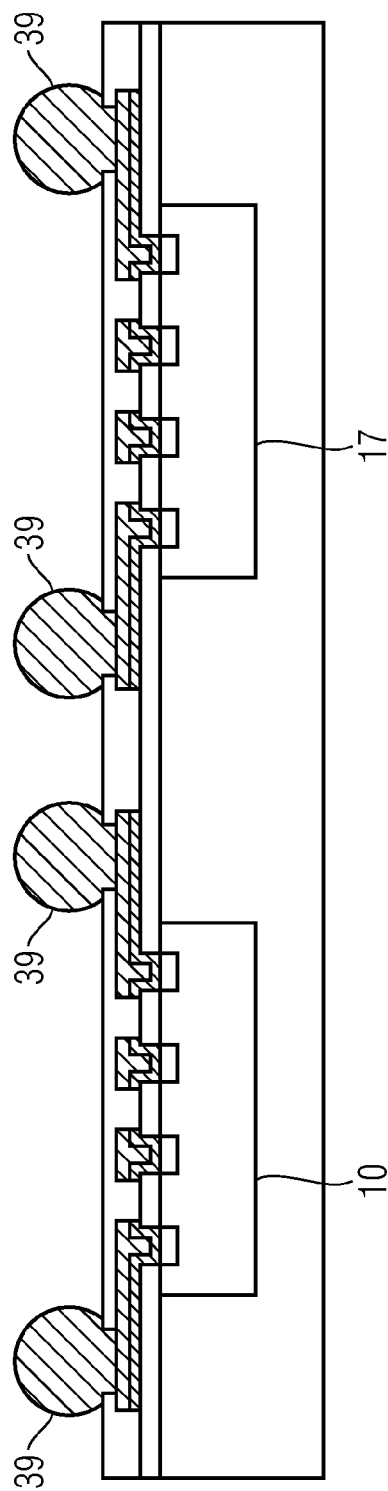
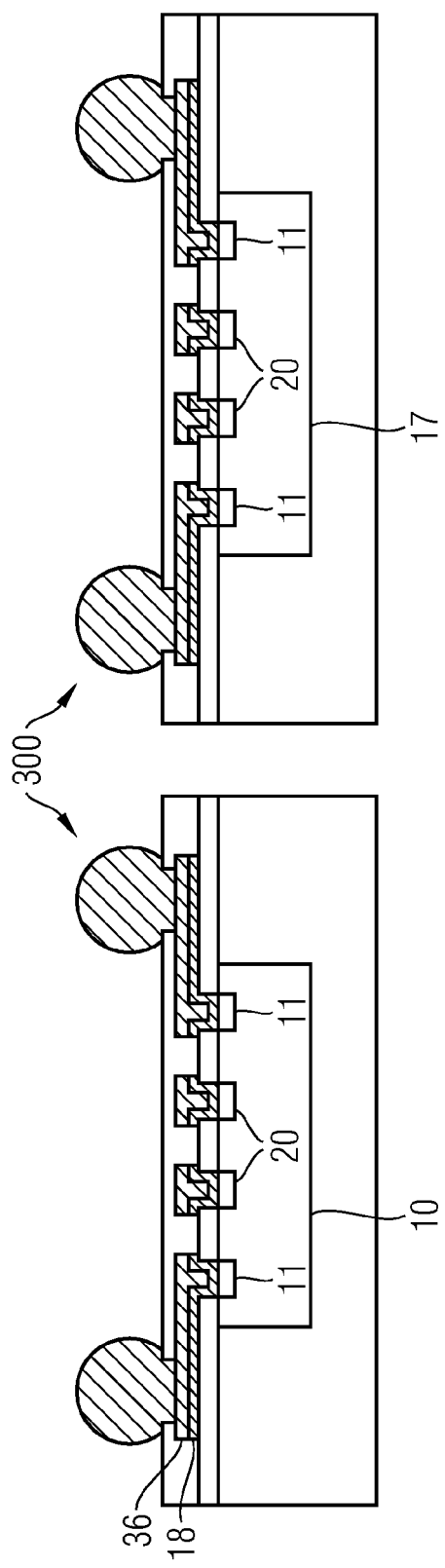

DEVICE INCLUDING A RING-SHAPED METAL STRUCTURE AND METHOD

BACKGROUND

One aspect relates to a device including a semiconductor chip having a ring-shaped metal structure and an external contact pad coupled to the ring-shaped metal structure. Furthermore, the invention relates to a method of manufacturing such a device.

Electronic devices including semiconductor chips concentrate heat in a very small space. In order to ensure the reliability of the devices, heat accumulation in the interior of the devices should be reduced. Therefore, ways are sought to improve the heat transfer away from the devices to maintain acceptable operating conditions.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
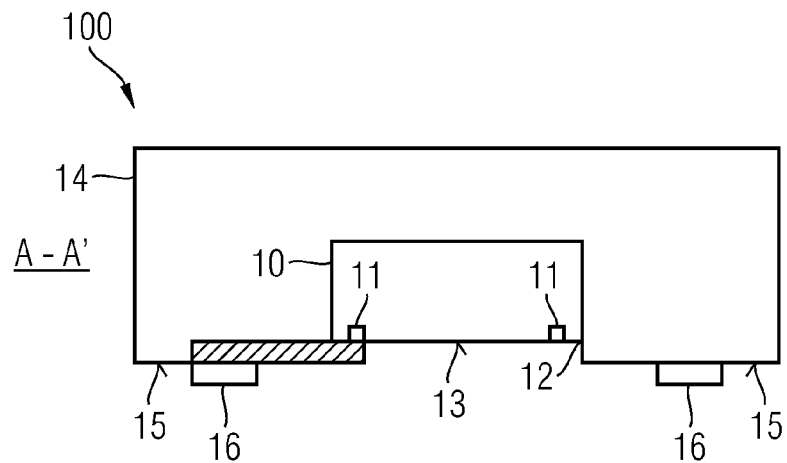
FIGS. 1A and 1B schematically illustrate a cross-sectional view and a plan view of one embodiment of a device including a semiconductor chip having a ring-shaped metal structure, an encapsulation body and an array of external contact pads.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various embodiments described herein may be combined with each other, unless specifically noted otherwise.

As employed in this Specification, the terms "coupled" and/or "electrically coupled" are not meant to mean that the elements must be directly coupled together; intervening elements may be provided between the "coupled" or "electrically coupled" elements.

Devices containing semiconductor chips are described below. The semiconductor chips may be of different types, may be manufactured by different technologies and may include for example integrated electrical, electro-optical or electro-mechanical circuits or passives. The integrated circuits may, for example, be designed as logic integrated circuits, analog integrated circuits, mixed signal integrated circuits, power integrated circuits, memory circuits or integrated passives. Furthermore, the semiconductor chips may include high-frequency circuits and, in one embodiment, millimeter wave integrated circuits that operate at microwave frequencies in the range from 1 to 300 GHz. The semiconductor chips need not be manufactured from specific semiconductor material, for example Si, SiC, SiGe, GaAs, and, furthermore, may contain inorganic and/or organic materials that are not semiconductors, such as for example discrete passives, antennas, insulators, plastics or metals.

The semiconductor chips may have contact pads (or electrodes), which allow electrical contact to be made with the integrated circuits included in the semiconductor chips. One or more metal layers may be applied to the contact pads of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible. The contact pads may be situated on the active main surfaces of the semiconductor chips or on other surfaces of the semiconductor chips.

Each semiconductor chip may include a ring-shaped metal structure extending along the contour of the active main surface of the semiconductor chip. The ring-shaped metal structure may be continuous and may extend along the entire contour of the active main surface. The ring-shaped metal structure may be also discontinuous and may include one or more gaps. The ring-shaped metal structure may be fabricated when the semiconductor chip is still in the wafer bond, i.e. before the wafer is diced to produce the individual semiconductor chips. The semiconductor chip contains a semiconductor substrate, for example a silicon or gallium arsenide substrate, and a number of metal layers stacked over the semiconductor substrate. In the area of the ring-shaped metal structure, vias may connect adjacent metal layers so that the top metal layer of the ring-shaped metal structure is coupled to the semiconductor substrate.

The devices described below include external contact pads (or external contact elements), which may be of any shape and size. The external contact pads may be accessible from outside the device (or solder deposits may be placed on the external contact pads) and may thus allow electrical contact to be made with the semiconductor chips from outside the device. Furthermore, the external contact pads may be thermally conductive and may serve as heat sinks for dissipating the heat generated by the semiconductor chips. The external contact pads may be composed of any desired electrically conductive material, for example of a metal, such as copper, aluminum, nickel or gold, a metal alloy or an electrically conductive organic material. Solder material, such as solder balls or solder bumps, may be deposited on the external contact pads.

Two or more metal layers may be placed over the semiconductor chip. The metal layers may, for example, be used to produce a redistribution layer. The metal layers may be employed as wiring layers to make electrical contact with the semiconductor chips from outside the device and/or to make electrical contact with other semiconductor chips and/or components contained in the device. The metal layers may couple the contact pads of the semiconductor chips to the external contact pads. The metal layers may have other functions as well, for example they may be used as ground or electrical shielding layers. The metal layers may be manufactured with any desired geometric shape and any desired material composition. For example, the metal layers may be structured and may have the shape of conductor lines (or conductor tracks), but may also be in the form of a layer covering an area. Any desired metal, for example aluminum, nickel, palladium, titanium, titanium tungsten, silver, tin, gold or copper, or metal alloys may be used as the material. The metal layers need not be homogenous or manufactured from just one material, that is to say various compositions and concentrations of the materials contained in the metal layers are possible. Furthermore, the metal layers may be arranged above or below or between electrically insulating layers.

The semiconductor chips or at least parts of the semiconductor chips may be covered with an encapsulation material. The encapsulation material may be electrically insulating and may be any appropriate duroplastic, thermoplastic or thermosetting material or laminate (prepreg) and may contain filler materials. Various techniques may be employed to cover the semiconductor chips with the electrically insulating material, for example compression molding, injection molding, powder molding, liquid molding or lamination.

The encapsulation material may be used to produce fan-out type packages. In a fan-out type package at least some of the external contact pads and/or metal layers connecting the semiconductor chip to the external contact pads are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards etc. This outer part of the package encompassing the semiconductor chip effectively enlarges the contact area of the package in relation to the footprint of the semiconductor chip, thus leading to relaxed constraints in view of package pad size and pitch with regard to later processing, e.g. second level assembly.

Figure 1B:
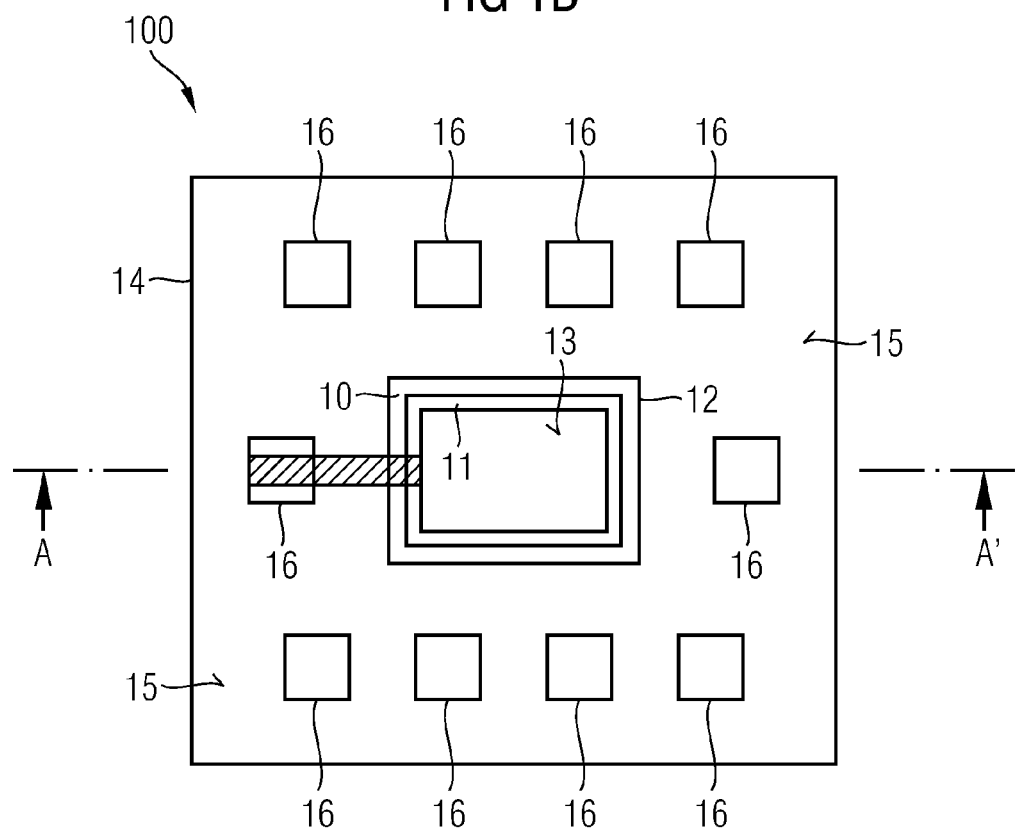

FIGS. 1A and 1B schematically illustrate a device 100 in cross-sectional and plan views. FIG. 1A illustrates the cross section through the device 100 along a line A-A' that is depicted in FIG. 1B. The device 100 includes a semiconductor chip 10, which has a ring-shaped metal structure 11 extending along the contour 12 of a first main surface 13 of the semiconductor chip 10. An encapsulation body 14 encapsulates the semiconductor chip 10 and defines a second main surface 15. An array of external contact pads 16 is attached to the second main surface 15 of the encapsulation body 14. At least one external contact pad 16 of the array of external contact pads 16 is electrically coupled to the ring-shaped metal structure 11 of the semiconductor chip 10.

Figure 2A:
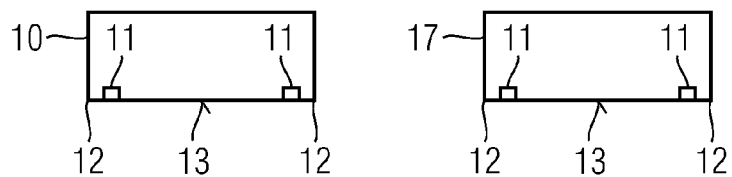
FIGS. 2A to 2E schematically illustrate a cross-sectional view of one embodiment of a method of manufacturing a device including a semiconductor chip having a ring-shaped metal structure, an encapsulation body and an array of external contact pads.
Figure 2B:
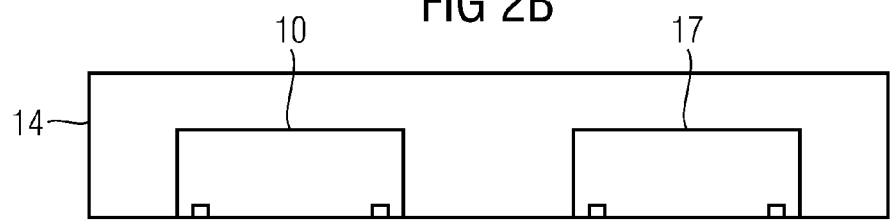
Figure 2C:
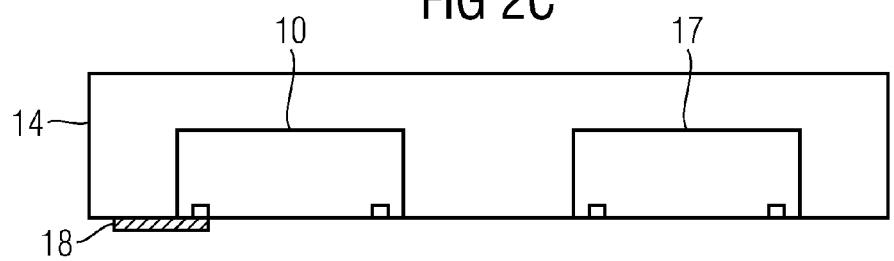
Figure 2D:
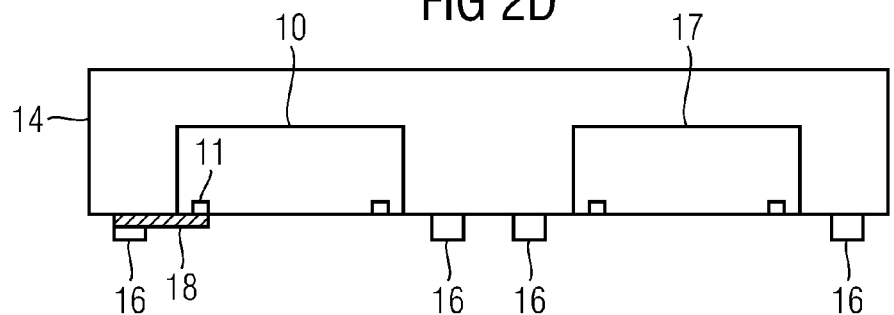
Figure 2E:
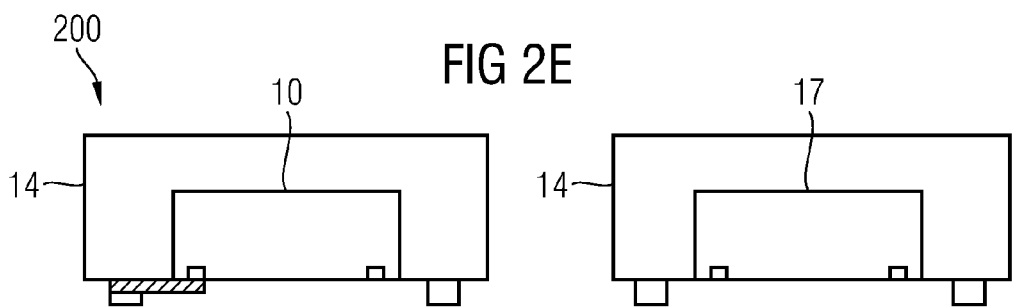

FIGS. 2A to 2E schematically illustrate a method for production of a device 200. A cross section of the device 200 obtained by the method is illustrated in FIG. 2E. A first semiconductor chip 10 and a second semiconductor chip 17 are provided (see FIG. 2A). Both semiconductor chips 10 and 17 include a ring-shaped metal structure 11 extending along the contour 12 of a first main surface 13 of the respective semiconductor chip 10 and 17. The semiconductor chips 10 and 17 are covered with an encapsulation material 14 forming an encapsulation body (see FIG. 2B). A metal layer 18 is deposited over the first semiconductor chip 10 and the encapsulation material 14 (see FIG. 2C). A plurality of external contact pads 16 is placed over the encapsulation material 14 (see FIG. 2D). The metal layer 18 electrically couples at least one external contact pad 16 of the plurality of external contact pads 16 to the ring-shaped metal structure 11 of the first semiconductor chip 10. The first semiconductor chip 10 is separated from the second semiconductor chip 17 by removing the encapsulation material 14 partially.

Figure 3B:
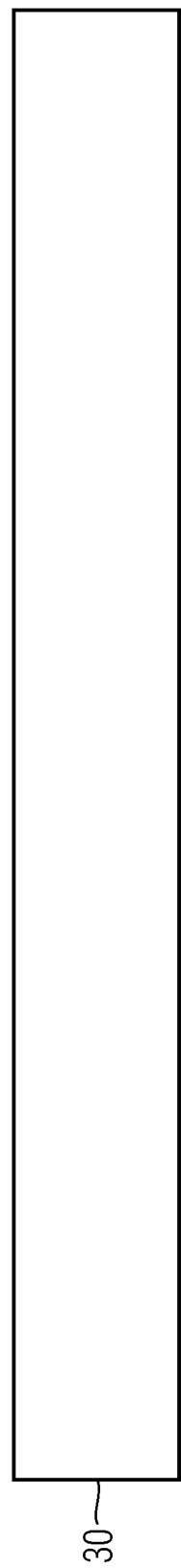
FIGS. 3A to 3P schematically illustrate one embodiment of a method of manufacturing a device including a semiconductor chip embedded in an encapsulation material, a metallization layer and solder balls deposited on external contact pads.
Figure 3C:
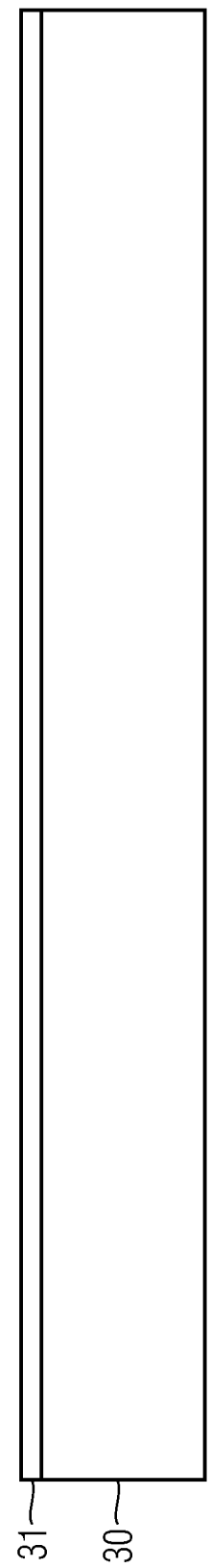
Figure 3L:
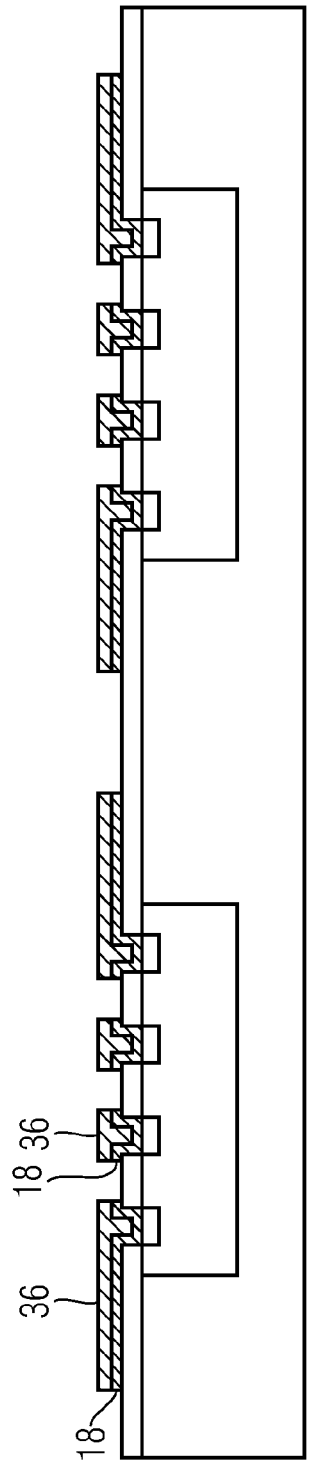
Figure 3M:
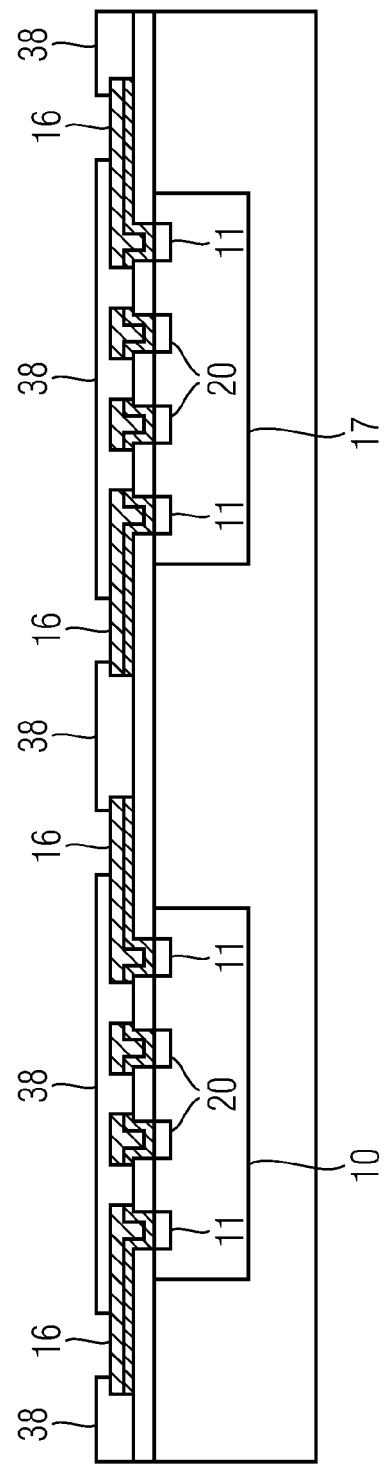
Figure 3P:
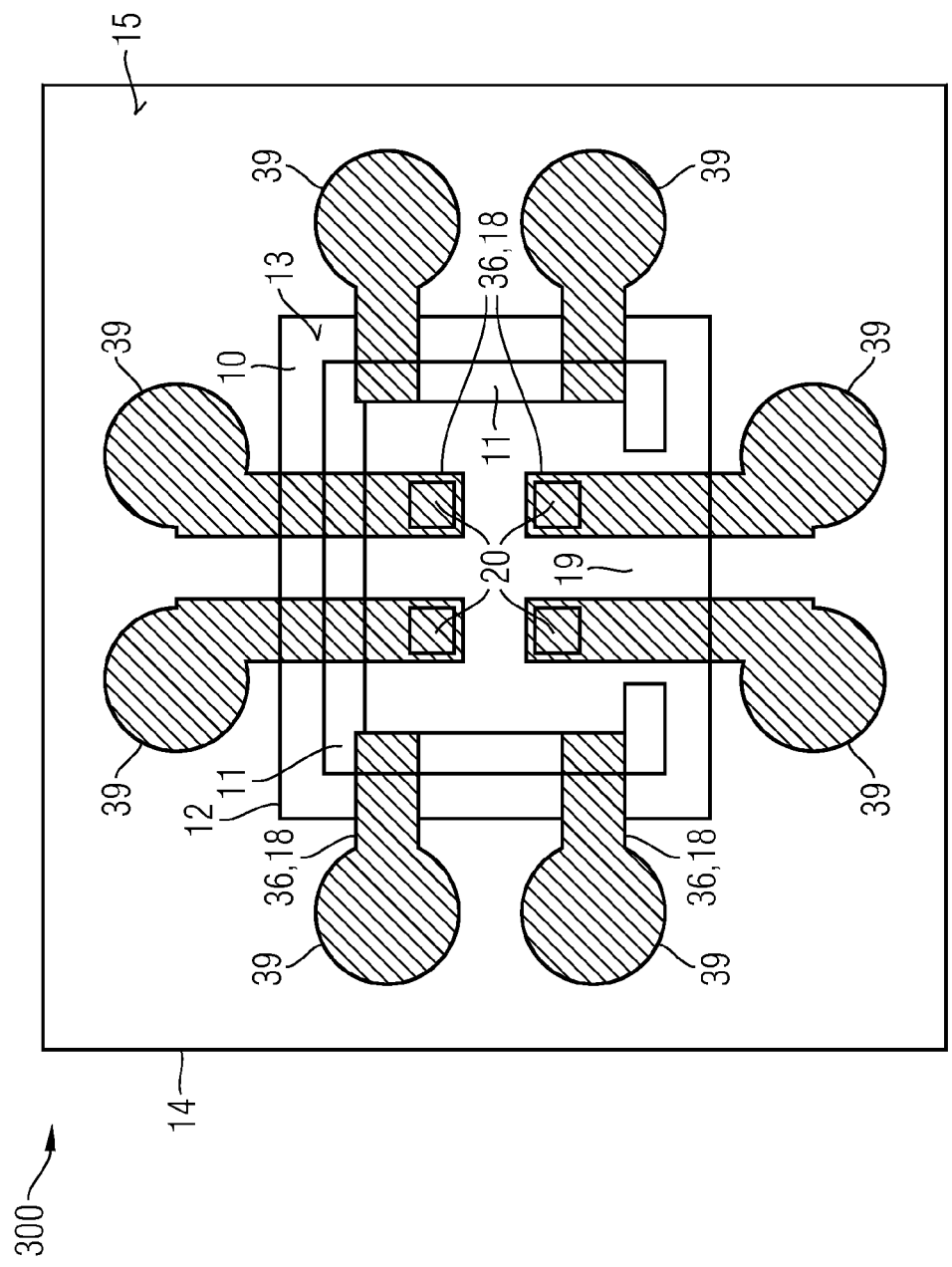

FIGS. 3A to 3P schematically illustrate a method for production of a device 300, a cross-sectional view and a plan view of which are illustrated in FIGS. 3O and 3P, respectively. The device 300 is an implementation of the devices 100 and 200. The details of the device 300 that are described below can therefore be likewise applied to the devices 100 and 200. Furthermore, the method illustrated in FIGS. 3A to 3P is an implementation of the method illustrated in FIGS. 2A to 2E. The details of the production method that are described below can therefore be likewise applied to the method of FIGS. 2A to 2E.

Firstly, a plurality of semiconductor chips 10 is provided. One of these semiconductor chips 10 is exemplarily illustrated on the left side of FIG. 3A in cross-sectional and plan views. A portion of the cross-section of the semiconductor chip 10 indicated by dashed lines is illustrated enlarged on the right hand side of FIG. 3A.

The semiconductor chip 10 illustrated in FIG. 3A has a first main surface 13, on which a plurality of contact pads 20 may be located. The integrated circuits embedded in the semiconductor chip 10 can be electrically accessed via the contact pads 20. The contact pads 20 may be made of a metal, for example gold, aluminum or copper. Furthermore, the semiconductor chip 10 has a ring-shaped metal structure 11 extending along the contour 12 of the main surface 13 of the semiconductor chip 10. The contour of the main surface 13 may be defined by the edges between the main surface 13 and the side surfaces of the semiconductor chip 10. In the example of FIG. 3A, the contour 12 of the main surface 13 has a length of $2a+2b$. The ring-shaped metal structure 11 may be continuous and may extend along the entire contour 12 of the main surface 13. The ring-shaped metal structure 11 may be also discontinuous and may include one or more gaps. In the example of FIG. 3A the ring-shaped metal structure 11 has one gap 19. For example, the ring-shaped metal structure 11 may extend along more than 50% or 60% or 70% or 80% or 90% of the contour 12.

The distance $d_1$ between the ring-shaped metal structure 11 and the adjacent edge of the semiconductor chip 10 may be in the range from 1 to 200 μm and may be, in one embodiment, smaller than 150 μm. The lateral width $d_2$ of the ring-shaped metal structure 11 may be in the range from 10 to 300 μm and in one embodiment may be smaller than 100 µm. The distance $d_3$ of the ring-shaped metal structure 11 reaching into the chip body may be more than 0.5 µm and in one embodiment more than 5 µm or even more than 10 µm. It may be provided that the ring-shaped metal structure 11 surrounds some or all of the contact pads 20.

The inner structure of the ring-shaped metal structure 11 is illustrated on the right hand side of FIG. 3A. The ring-shaped metal structure 11 may be fabricated when the semiconductor chip 10 is still in the wafer bond, i.e. before the wafer is diced to produce the individual semiconductor chips. The semiconductor chip 10 contains a semiconductor substrate 21, for example a silicon or gallium arsenide substrate, and a number of metal layers 22 stacked over the semiconductor substrate 21. Between adjacent metal layers 22 dielectric layers 23, for example silicon nitride or silicon oxide layers, are arranged. In the area of the ring-shaped metal structure 11, vias 24 may connect adjacent metal layers 22 so that the top metal layer 22 of the ring-shaped metal structure 11 is coupled to the semiconductor substrate 21. The metal layers 22 and the vias 24 may be made of a metal or a metal alloy, for example copper, aluminum or gold. The top metal layer 23 may not be covered with the dielectric material 23 thus forming an exposed surface 25 of the ring-shaped metal structure 11. Apart form forming the ring-shaped metal structure 11, the metal layers 22 may be used to electrically interconnect the electrical components integrated into the semiconductor substrate 21.

The semiconductor chip 10 may further include a seal ring 26, which usually encloses all components of the semiconductor chip 10. Thus the seal ring 26 also encloses (surrounds) the ring-shaped metal structure 11. The inner structure of the seal ring 26 may be similar to the structure of the ring-shaped metal structure 11 illustrated on the right hand side of FIG. 3A, but the seal ring 26 may not have an exposed top surface. The seal ring 26 may be arranged between the ring-shaped metal structure 11 and the side surfaces of the semiconductor chip 10. The function of the seal ring 26 may be to protect the integrated circuits of a semiconductor wafer when dividing the semiconductor wafer into separated semiconductor chips. Before dividing the semiconductor wafer, a scribing line is formed between any two adjacent semiconductor chips to facilitate the dicing of the semiconductor wafer. The stress generated during the scribing and dicing may cause damage to the integrated circuits. Therefore, a seal ring is normally formed between the semiconductor chips and the scribing line to prevent the integrated circuits from being damaged during the scribing and dicing process.

The semiconductor chip 10 may contain an integrated circuit for the transmission and/or reception of radio signals. The semiconductor chip 10 may, for example, be an millimeter wave integrated circuit (MMIC), which includes a signal generator producing signals having frequencies in the range from 1 to 300 GHz and thus have wavelengths in the millimeter range. A MMIC may be used for automotive radar tracking, for example adaptive cruise control (ACC) systems.

In order to manufacture the device 300, a carrier 30 is provided as illustrated in FIG. 3B. The carrier 30 may be a plate made of a rigid material, for example a metal, such as nickel, steel or stainless steel, laminate, film or a material stack. The carrier 30 may have at least one flat surface on which components of the device 300 can be placed. The shape of the carrier 30 is not limited to any geometric shape, for example the carrier 30 may be round or square-shaped. The carrier 30 may have any appropriate size.

An adhesive tape 31, for example a double sided sticky tape, may be laminated onto a surface of the carrier 30 as illustrated in FIG. 3C. The surface of the carrier 30 on which the adhesive tape 31 is laminated is the surface where the components of the device 300 are placed later on.

As illustrated in FIG. 3D, the semiconductor chips 10 and 17 as well as possibly further semiconductor chips are placed over the carrier 30 (only the semiconductor chips 10 and 17 are illustrated in FIG. 3D). The semiconductor chips 10 and 17 may be arranged over the carrier 30 with their first main surfaces 13 facing the carrier 30. The semiconductor chips 10 and 17 can be fixed on the adhesive tape 31. For attaching the semiconductor chips 10 and 17 to the carrier 30, other kinds of attaching materials may in one embodiment be used. The semiconductor chips 10 and 17 and the further semiconductor chips may be arranged in an array.

The semiconductor chips 10 and 17 are relocated on the carrier 30 in larger spacing as they have been in the wafer bond. The semiconductor chips 10 and 17 may have been manufactured on the same semiconductor wafer, but may in one embodiment have been manufactured on different wafers. Furthermore, the semiconductor chips 10 and 17 may be physically identical, but may also contain different integrated circuits and/or represent other components. Before the semiconductor chips 10 and 17 are placed on the carrier 30, they may be thinned, for example by grinding their backsides, down to a thickness in the range from 30 to 300 µm. The function and dimensions of the semiconductor chip 10 may be different from the function and dimensions of the semiconductor chip 17, however both semiconductor chips 10 and 17 may also have the same functions and dimensions. For example, the semiconductor chips 10 and 17 may be MMICs.

After the semiconductor chips 10 and 17 have been mounted on the carrier 30, they are encapsulated by an electrically insulating encapsulation material 14 thereby forming a layer of the electrically insulating material 14 as illustrated in FIG. 3E. For example, the encapsulation material 14 may be a duroplastic or thermosetting mold material. The gaps between the semiconductor chips 10 and 17 are also filled with the mold material 14 so that the mold material 14 covers the side surfaces of the semiconductor chips 10 and 17. The mold material 14 may be based on an epoxy material and may contain a filling material consisting of small particles of glass ($SiO_2$) or other electrically insulating mineral filler materials like $Al_2O_3$ or organic filler materials.

As an alternative to the mold material, another polymer material may be used as the electrically insulating material 14 to encapsulate the semiconductor chips 10 and 17. The polymer material 14 may have the shape of an electrically insulating foil or sheet, which is laminated on top of the semiconductor chips 10 and 17 as well as the carrier 30. Heat and pressure may be applied for a time suitable to attach the polymer foil or sheet 14 to the underlying structure. The gaps between the semiconductor chips 10 and 17 are also filled with the polymer material 14. The polymer material 14 may, for example, be a prepreg (short for preimpregnated fibers) that is a combination of a fiber mat, for example glass or carbon fibers, and a resin, for example a duroplastic material. Prepreg materials are usually used to manufacture PCBs (printed circuit boards). Well known prepreg materials that are used in PCB industry and that can be used here as the polymer material 14 are: FR-2, FR-3, FR-4, FR-5, FR-6, G-10, CEM-1, CEM-2, CEM-3, CEM-4 and CEM-5. Prepreg materials are bi-stage materials, which are flexible when applied over the semiconductor chips 10 and 17 and hardened during a heat-treatment. For the lamination of the prepreg the same or similar processes can be used as in PCB manufacturing.

The semiconductor chips 10 and 17 covered with the electrically insulating material 14 are released from the carrier 30, and the adhesive tape 31 is pealed from the semiconductor chips 10 and 17 as well as from the encapsulation material 14 as illustrated in FIG. 3F. The adhesive tape 31 may feature thermo-release properties, which allow the removal of the adhesive tape 31 during a heat-treatment. The removal of the adhesive tape 31 from the carrier 30 is carried out at an appropriate temperature, which depends on the thermo-release properties of the adhesive tape 31.

After the release of the carrier 30 and the adhesive tape 31 the first main surfaces 13 of the semiconductor chips 10 and 17 as well as the bottom surface of the encapsulation material 14, which is the second main surface 15, form a common planar surface, i.e. the first main surfaces 13 and the second main surface 15 are coplanar. In one embodiment, the surfaces 13 and 15 may be plane-parallel. As described in the following, a redistribution layer may be applied to the main surfaces 13 and 15.

A dielectric layer 32 may be deposited on the main surfaces 13 and 15 as illustrated in FIG. 3G. The dielectric layer 32 may be fabricated in various ways. For example, the dielectric layer 32 may be deposited from a gas phase or from a solution, or can be laminated onto the main surfaces 13 and 15. Furthermore, thin-film technology methods or a standard PCB industry process flow can be used for the application of the dielectric layer 32. The dielectric layer 32 may be fabricated from a polymer, such as parylene, photoresist material, imide, epoxy, duroplast, silicone, silicon nitride or an inorganic, ceramic-like material, such as silicone-carbon compounds. The thickness of the dielectric layer 32 may be up to 10 μm or even higher.

In order to make electrical contacts to the integrated circuits and the ring-shaped metal structure 11 embedded in the semiconductor chips 10 and 17, the dielectric layer 32 may be opened in areas where the contact pads 20 are arranged as illustrated in FIG. 3G. Furthermore, the dielectric layer 32 may be removed from at least portions of the top surface 25 of the ring-shaped metal structure 11. The openings 33 in the dielectric layer 32 may, for example, be produced by using photolithographic methods and/or etching methods.

The dielectric layer 32 may also be omitted. In cases where electrodes, in one embodiment back side electrodes, of the semiconductor chips 10 and 17 reach to the side surfaces of the semiconductor chips 10 and 17, the dielectric layer 32 may prevent short circuits with metal layers of the redistribution layer. Furthermore, conductor tracks may cross the ring-shaped metal structure 11 as described further below. In this case, the dielectric layer 32 isolates these conductor tracks from the ring-shaped metal layer 11.

A metal layer 18 is placed over the dielectric layer 32 as illustrated in FIG. 3H. The metal layer 18 also covers the contact pads 20 and the portions of the ring-shaped metal structure 11 exposed by the openings 33 in the dielectric layer 32. The metal layer 18 may have a thickness, which may be smaller than 300 nm. The metal layer 18 may be deposited by using, for example, sputtering, electroless deposition, evaporation or any other appropriate technique. Sputtering is a process whereby small particles, for example atoms, are ejected from a solid target material due to bombardment of the target by energetic particles, for example ions. Electroless deposition (also known as electroless or chemical or auto-catalytic or non-galvanic plating) involves the deposition of metal particles from a solution onto a surface without the use of external electrical power. That means that the solution containing the metal particles is applied to the surface to be coated with the metal, and the metal particles then adhere to the surface without the need of applying an external voltage to the solution and the surface. Evaporation involves evaporating a source material in a vacuum. The vacuum allows vapor particles to travel directly to the surface to be covered where the vapor particles condense back to a solid state.

According to one embodiment, the metal layer 18 may be composed of two thin metal layers stacked on each other. First a layer of titanium, titanium tungsten, chromium or any other suitable metal or metal alloy may be deposited on the top surfaces of the dielectric layer 32, the exposed contact pads 20 and the exposed portions of the ring-shaped metal structure 11. In one embodiment this layer may have a thickness smaller than 100 nm and in one embodiment about 50 nm. The function of the this layer may be to promote the adhesion of further metal layers and to prevent the diffusion of metal particles into the semiconductor chips 10 and 17. A further metal layer, for example a copper layer, may be deposited on the adhesion promoter/diffusion barrier layer. In one embodiment this layer may have a thickness smaller than 200 nm and in one embodiment about 150 nm. The function of this layer may be to provide sufficient electrical conductivity to act as a seed layer for galvanic deposition later on. The adhesion promoter/diffusion barrier layer as well as the seed layer may be deposited by using sputtering, electroless deposition, evaporation or any other appropriate technique.

A plating resist layer 35, for example a photoresist layer, may be spin-coated on top of the metal layer 18. By exposure to light having a suitable wavelength through a mask and subsequent development, the plating resist layer 35 is selectively removed as illustrated in FIG. 3I. Instead of spin-coating, exposure to light and development, the plating resist layer 35 may also be deposited by using printing techniques.

Subsequently, the parts of the metal layer 18, which are not covered with the plating resist layer 35, may be reinforced by galvanic deposition of a further metal layer 36 as illustrated in FIG. 3J. During the galvanic deposition of the metal layer 36, the metal layer 18 is employed as an electrode. Copper or other metals or metal alloys may be plated onto the metal layer 18 in the unmasked areas and to the desired height, which may be larger than 2 μm or 3 μm or 4 μm or 5 μm or 6 μm or 7 μm or 8 μm or 9 μm or 10 μm. Furthermore, another metal layer, for example a nickel layer, may be galvanically plated on top of the metal layer 36 to avoid the consumption of copper of the metal layer 36 by solder deposits which may be applied to the redistribution layer later on.

After the plating of the metal layer 36 the plating resist layer 35 is stripped away by using an appropriate solvent as illustrated in FIG. 3K. The now exposed parts of the metal layer 18, which are not covered with the metal layer 36, may be removed by one or more etching processes thereby creating a structured metal layer consisting of the metal layers 18 and 36 as illustrated in FIG. 3L.

A dielectric layer 38 may be deposited on top of the metal layer 36 and may be opened in areas where external contact pads 16 are arranged as illustrated in FIG. 3M. The dielectric layer 38 may be produced and structured by using the same or similar materials and processes as described above in connection with the dielectric layer 32. The external contact pads 16 allow to electrically contact the contact pads 20 and the ring-shaped metal structure 11 of the semiconductor chips 10 and 17 from outside the devices 300.

Solder deposits 39 may be placed onto the external contact pads 16 as illustrated in FIG. 3N. The solder deposits 39 may be applied to the external contact pads 16 by "ball placement", in which pre-shaped balls composed of solder material are applied to the external contact pads 16. As an alternative to "ball placement", the solder deposits 39 may, for example, be applied by using stencil printing with a solder paste, followed by a heat-treatment process. The solder material may be formed from metal alloys which are composed, for example, from the following materials: SnPb, SnAg, SnAgCu, SnAgCuNi, SnAu, SnCu and SnBi. The solder deposits 39 may be used to electrically couple the devices 300 to other components, for example a PCB (printed circuit board).

As illustrated in FIG. 3O, the devices 300 (and the semiconductor chips 10 and 17) are separated from one another by removing parts of the redistribution layer and the encapsulation material 14, for example by sawing, cutting, milling, etching or a laser beam.

The devices 300 manufactured by the method described above are fan-out type packages. The encapsulation material 14 allows the redistribution layer to extend beyond the contour 12 of the semiconductor chips 10 and 17. The external contact pads 16 and the solder deposits 39 therefore do not need to be arranged within the contour 12 of the semiconductor chips 10 or 17 but can be distributed over a larger area. The increased area which is available for arrangement of the external contact pads 16 as a result of the encapsulation material 14 means that the external contact pads 16 cannot only be arranged at a great distance from one another, but that the maximum number of external contact pads 16 which can be arranged there is likewise increased compared to the situation when all the external contact pads 16 are arranged within the contour 12 of the semiconductor chip 10 and 17. Furthermore, due to the encapsulation body 14 surrounding the semiconductor chips 10 and 17 the external contact pads 16 do not need to be placed over the semiconductor chips 10 and 17 itself. In case the semiconductor chips 10 and 17 contain integrated circuits generating high frequencies, for example MMICs generating frequencies in the range from 1 to 300 GHz, placing the external contact pads 16 over these circuits may lead to resonance phenomena and may impact the function of the semiconductor chips 10 and 17.

FIG. 3P illustrates a plan view of the device 300. In this embodiment, the solder deposits 39 depicted on the left and right hand sides of FIG. 3P are electrically coupled to the ring-shaped metal layer 11 via conductor lines formed of the metal layers 18 and 36. The metallic connection between the semiconductor substrate 21 of the semiconductor chip 10 and the solder deposits 39 (see also FIG. 3A) allows to transfer the heat generated by the integrated circuits in the semiconductor substrate 21 to the solder deposits 39 and the circuit board, to which the device 300 is mounted during operation, which dissipate the heat generated by the semiconductor chip 10. The more solder deposits 39 are thermally coupled to the ring-shaped metal structure 11, the more effective the semiconductor chip 10 is cooled. It may be provided that the solder deposits 39 which are electrically coupled to the ring-shaped metal structure 11 are coupled to ground or mass potential at the circuit board.

The solder deposits 39 depicted at the top and bottom of FIG. 3P are electrically coupled to the contact pads 20 of the semiconductor chip 10 via conductor lines formed of the metal layers 18 and 36. It may be provided that the conductor lines used for low frequency signals (lower than 1 MHz) may cross the ring-shaped metal structure 11 and may be electrically insulated from the ring-shaped metal structure 11 by the dielectric layer 32 (see solder deposits 39 depicted at the top of FIG. 3P). In the case of high frequency signals, for example in the range from 1 to 300 GHz, resonance phenomena may occur if the conductor lines transmitting these signals cross the ring-shaped metal structure 11. For this reason, these conductor lines are passed through the gap 19 in the ring-shaped metal structure 11 (see solder deposits 39 depicted at the bottom of FIG. 3P).

It is obvious to a person skilled in the art that the device 300 and the manufacturing thereof as described above are only intended to be an embodiment, and many variations are possible. For example, further semiconductor chips or passives may be included in the same device 300. The semiconductor chips and passives may differ in function, size, manufacturing technology etc. Moreover, the redistribution layer of the device 300 may include further metal layers stacked on top of each other. These metal layers may be insulated from each other by dielectric layers.

Figure 4:
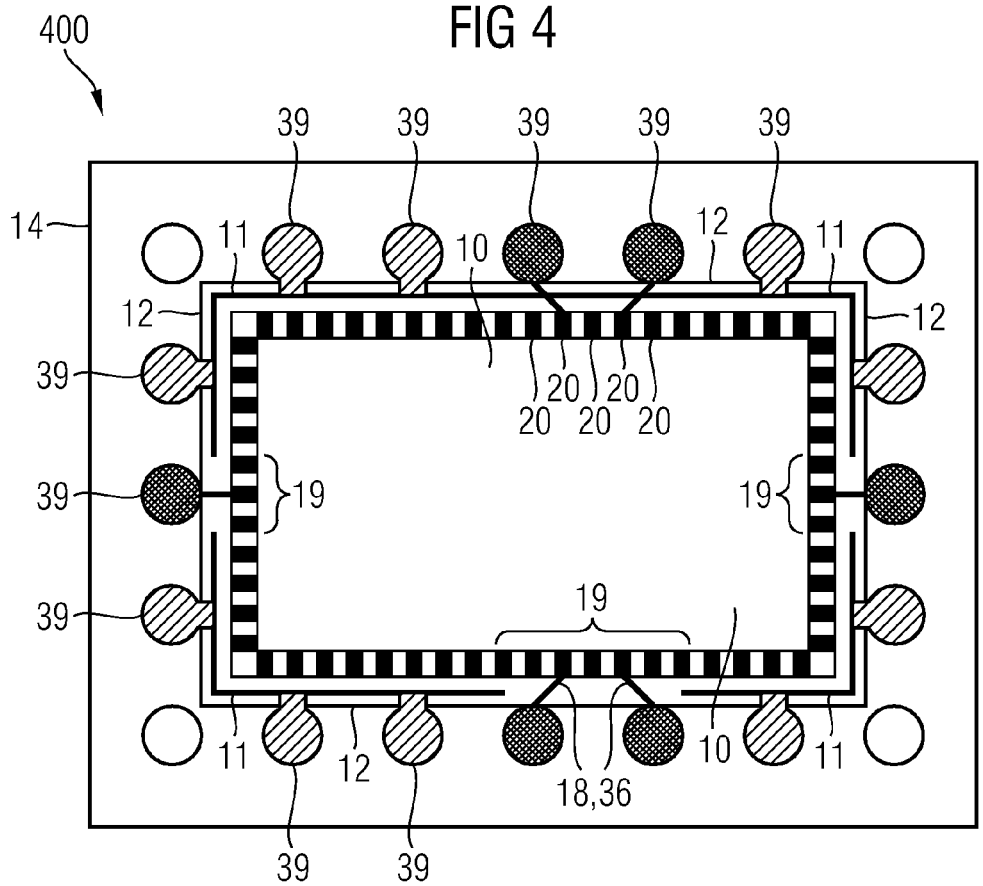
FIG. 4 schematically illustrates a plan view of one embodiment of a device including a semiconductor chip including a millimeter wave circuit and a plurality of solder balls.

In FIG. 4 a device 400 is schematically illustrated in plan view. The device 400 is similar to the device 300, but includes more solder deposits 39 which are electrically and thermally coupled to the ring-shaped metal structure 11 of the semiconductor chip 10. In the present embodiment, ten solder deposits 39 are coupled to the ring-shaped metal structure 11. The device 400 includes a plurality of contact pads 20 arranged in an array. Some of the contact pads 20 are electrically coupled to the solder deposits 39 via the metal layers 18 and 36. The ring-shaped metal structure 11 of the device 400 has three gaps 19. Conductor lines transmitting signals having frequencies higher than 1 GHz may pass through the gaps 19. Conductor lines transmitting signals having smaller frequencies may cross the ring-shaped metal structure 11.

Figure 5:
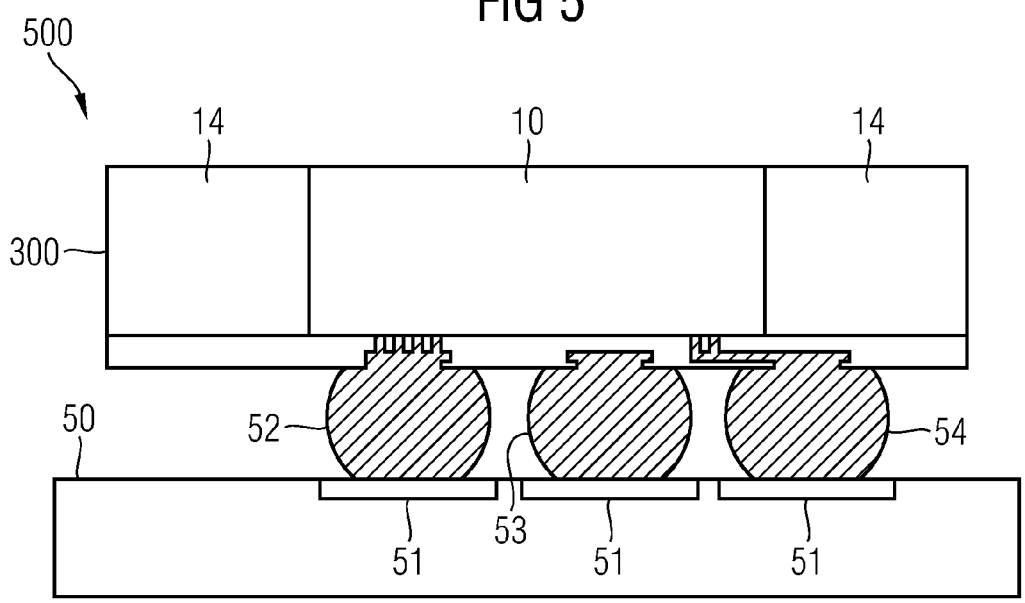
FIG. 5 schematically illustrates a cross-sectional view of one embodiment of a system including a circuit board and a device mounted on the circuit board.

FIG. 5 schematically illustrates a system 500 in cross section. The system 500 includes a circuit board 50, such as a PCB, and the device 300 mounted on the circuit board 50. The solder balls of the device 300 are soldered to contact pads 51 of the circuit board 50. The heat generated by the semiconductor chip 10 is removed by heat conduction to the circuit board 50 by the solder balls connected to the ring-shaped metal structure 11 within the semiconductor chip 10. The thermal resistance of the solder balls depend strongly on their position relative to the semiconductor chip 10 and on their metallic connection to the ring-shaped metal layer 11. For a simplified discussion, FIG. 5 illustrates three different types of solder balls 52, 53 and 54. The heat transfer to the solder balls 52 and 53 located directly beneath the semiconductor chip 10 is fairly good. For the solder ball 52, which is connected to the semiconductor chip 10 in the shortest possible way, the thermal resistance is smaller than 100 K/W. For the solder ball 53, which is connected to the semiconductor chip 10 via the metal layers 18 and 36, the thermal resistance is smaller than 250 K/W. The thermal resistance of the connection between the semiconductor chip 10 and the solder ball 54, which is located outside the contour 12 of the semiconductor chip 10, is smaller than 400 K/W. Solder balls lying further away from the semiconductor chip 10 than the solder ball 54 have only very little contribution to the total heat flow. Therefore, most of the solder balls 54 arranged in the first row outside the contour 12 of the semiconductor chip 10 are used for heat dissipation. For example, at least 50% of the solder balls 54 arranged in the first row outside the contour 12 may be electrically coupled to the ring-shaped metal structure 11. These solder balls 54 may be connected in the shortest possible way to the semiconductor substrate 21 of the semiconductor chip 10. In order to provide good heat transfer, the ring-shaped metal structure 11 may include a densely packed metal stack.

Figure 6:
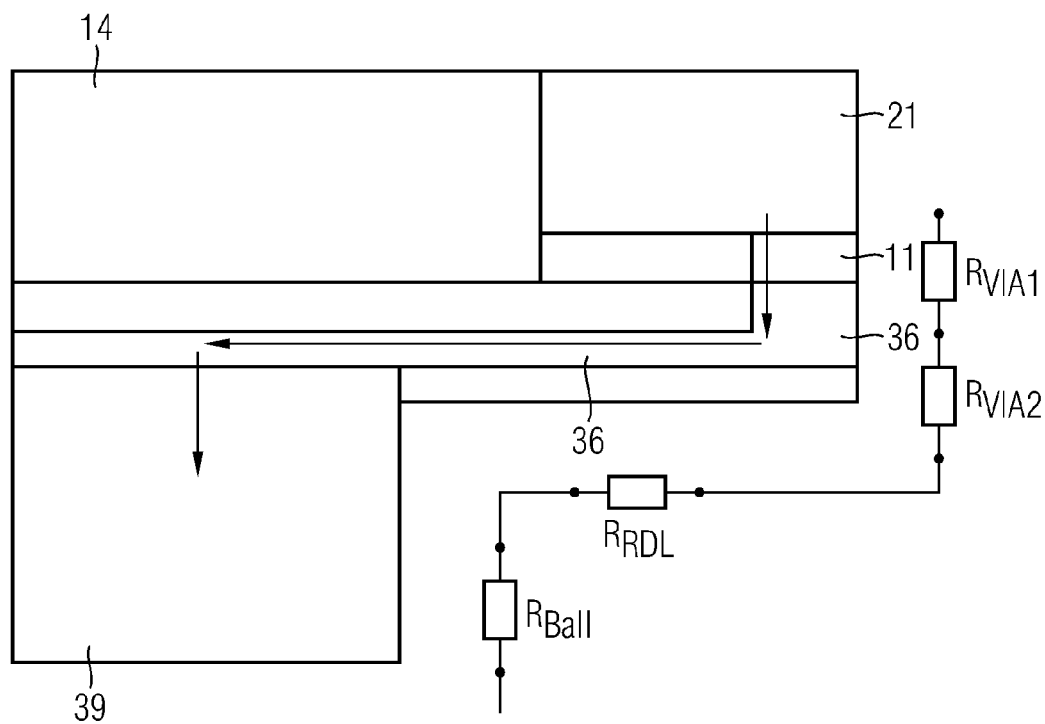
FIG. 6 schematically illustrates a heat transfer model.

FIG. 6 illustrates a model to calculate the thermal resistance $R_{CONTACT}$ for the heat transfer from the semiconductor substrate 21 of the semiconductor chip 10 to the circuit board. The thermal resistance $R_{CONTACT}$ is composed of the thermal resistance $R_{VIA1}$ of the ring-shaped metal structure 11, the thermal resistance $R_{VIA2}$ of the via in the redistribution layer, the thermal resistance $R_{RDL}$ of the lateral conductor line of the redistribution layer and the thermal resistance $R_{BALL}$ of the solder ball:

$$R_{CONTACT} = R_{VIA1} + R_{VIA2} + R_{RDL} + R_{BALL} \quad (1)$$

Figure 7:
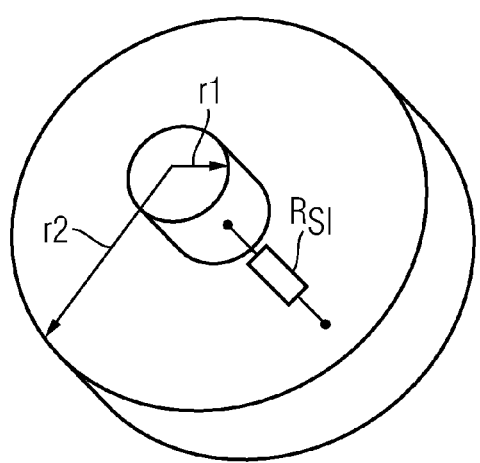
FIG. 7 schematically illustrates a further heat transfer model.

FIG. 7 illustrates a model to calculate the thermal resistance $R_{SI}$ for the heat transfer from the integrated circuit within the silicon substrate 21 generating the heat to the periphery of the silicon substrate 21 where the ring-shaped metal structure 11 is located. In the present model the silicon substrate 21 is cylindrical with a height d and a radius $r_2$. The heat is generated in the middle portion of the silicon substrate 21 having a radius $r_1$. The thermal resistance $R_{si}$ is calculated as follows:

$$R_{SI} = \ln(r_2/r_1)/(2\pi\lambda_{SI}d) \quad (2)$$

In the case of d=450 μm, $r_1$=100 μm, $r_2$=1 mm and λ=148 mK/W, the thermal resistance $R_{SI}$ is 5.5 K/W. In the case of d=450 μm, $r_1$=500 μm and $r_2$=2 mm, the thermal resistance $R_{SI}$ is 3.3 K/W. The thermal resistance $R_{SI}$ usually amounts to less than 10 K/W and contributes only little to the thermal resistance $R_{CONTACT}$.

In addition, while a particular feature or aspect of an embodiment of the invention may have been disclosed with respect to only one of several implementations, such feature or embodiment may be combined with one or more other features or embodiments of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A device comprising:
 a semiconductor chip comprising a ring-shaped metal structure extending along a contour of a first main surface of the semiconductor chip;
 an encapsulation body encapsulating the semiconductor chip and defining a second main surface;
 an array of external contact pads attached to the second main surface of the encapsulation body; and
 at least one external contact pad of the array of external contact pads electrically coupled to the ring-shaped metal structure;
 wherein the semiconductor chip comprises a seal ring located between the ring-shaped metal structure and the contour of the first main surface of the semiconductor chip.

2. The device of claim 1, wherein the semiconductor chip comprises a plurality of contact pads located on the first main surface of the semiconductor chip.

3. The device of claim 2, further comprising a metal layer electrically coupling the contact pads to the external contact pads.

4. The device of claim 3, wherein the metal layer extends over the first main surface and the second main surface.

5. The device of claim 2, wherein all of the contact pads are located within the ring-shaped metal structure.

6. The device of claim 1, wherein the first main surface and the second main surface are parallel.

7. The device of claim 1, wherein the first main surface and the second main surface are coplanar.

8. The device of claim 1, wherein the ring-shaped metal structure is a discontinuous ring-shaped structure.

9. The device of claim 8, wherein the ring-shaped metal structure extends along at least 60% of the contour of the first main surface of the semiconductor chip.

10. The device of claim 1, wherein the ring-shaped metal structure extends along the contour of the first main surface of the semiconductor chip at a distance smaller than 100 μm.

11. The device of claim 1, wherein the seal ring extends along the contour of the first main surface of the semiconductor chip and is a continuous ring-shaped structure.

12. The device of claim 1, wherein the semiconductor chip comprises a semiconductor substrate and the ring-shaped metal structure is coupled to the semiconductor substrate.

13. The device of claim 1, wherein the ring-shaped metal structure reaches more than 5 μm into the semiconductor chip.

14. The device of claim 1, wherein the ring-shaped metal structure has a lateral thickness of less than 100 μm.

15. The device of claim 1, wherein the first main surface of the semiconductor chip is exposed from the encapsulation body.

16. The device of claim 1, wherein the semiconductor chip comprises a high-frequency circuit to produce high-frequency signals having frequencies higher than 1 GHz.

17. A device comprising:
 a semiconductor chip comprising a ring-shaped metal structure extending along a contour of a first main surface of the semiconductor chip, the semiconductor chip further comprising a circuit produce signals having frequencies higher than 1 GHz;
 an encapsulation body encapsulating the semiconductor chip and defining a second main surface;
 an array of external contact pads attached to the second main surface of the encapsulation body; and
 at least one external contact pad of the array of external contact pads electrically coupled to the ring-shaped metal structure;
 wherein the semiconductor chip comprises a seal ring located between the ring-shaped metal structure and the contour of the first main surface of the semiconductor chip.

18. A device comprising:
 a semiconductor chip comprising a ring-shaped metal structure extending along a contour of a first main surface of the semiconductor chip, the semiconductor chip further comprising a seal ring arranged between the ring-shaped metal structure and the contour of the first main surface as well as a circuit to produce signals having frequencies higher than 1 GHz;
an encapsulation body encapsulating the semiconductor chip and defining a second main surface;
an array of external contact pads attached to the second main surface of the encapsulation body; and
at least one external contact pad of the array of external contact pads electrically coupled to the ring-shaped metal structure.

* * * * *